United States Patent [19]
Zenitani et al.

[11] Patent Number: 5,216,578
[45] Date of Patent: Jun. 1, 1993

[54] STRUCTURE FOR HOLDING PACKAGES ON BACKBOARD OF ELECTRONICS APPARATUS

[75] Inventors: Hideki Zenitani, Akishima; Takashi Kanno; Tsutomu Takahashi, both of Yokohama, all of Japan

[73] Assignee: Fujitsu Limited, Kawasaki, Japan

[21] Appl. No.: 754,957

[22] Filed: Sep. 4, 1991

[30] Foreign Application Priority Data

Sep. 4, 1990 [JP] Japan ................... 2-232373

[51] Int. Cl.⁵ ............................................. H05K 7/20
[52] U.S. Cl. ................................. 361/383; 211/41; 361/413; 361/415; 439/64; 439/377
[58] Field of Search .............. 248/27.1; 211/41; 439/61, 64, 377; 165/80.3; 174/16.1; 361/383, 384, 391, 399, 412, 413, 415

[56] References Cited

U.S. PATENT DOCUMENTS

| | | | |
|---|---|---|---|
| 4,466,049 | 8/1984 | Chaney | 361/383 |
| 4,869,673 | 9/1989 | Kreinberg | 439/64 |
| 4,914,552 | 4/1990 | Keemer | 361/415 |
| 4,996,631 | 2/1991 | Freehauf | 361/415 |
| 5,003,431 | 3/1991 | Imsdahl | 361/415 |
| 5,030,108 | 7/1991 | Babow | 439/64 |
| 5,057,968 | 10/1991 | Morrison | 361/385 |

FOREIGN PATENT DOCUMENTS

| | | |
|---|---|---|
| 0269608 | 1/1988 | European Pat. Off. . |
| 2371855 | 6/1978 | France . |
| 1233099 | 5/1971 | United Kingdom . |

Primary Examiner—Gerald P. Tolin
Attorney, Agent, or Firm—Staas & Halsey

[57] ABSTRACT

A package holding structure comprises a pair of linear guide members (11), secured on the package (2) along the respective edges thereof opposite to each other, and a pair of support members (10) for receiving the respective guide members (11), secured at one end thereof on the backboard (3) in a cantilever manner while projected vertically therefrom and having a connector housing (15) at the base end thereof for receiving a connector (14) on the package. The housing (15) has positioning apertures (13) to be fitted to contact pins (12) projected from the backboard (3).

7 Claims, 18 Drawing Sheets

Fig. 13A
(PRIOR ART)
Fig. 13B
(PRIOR ART)
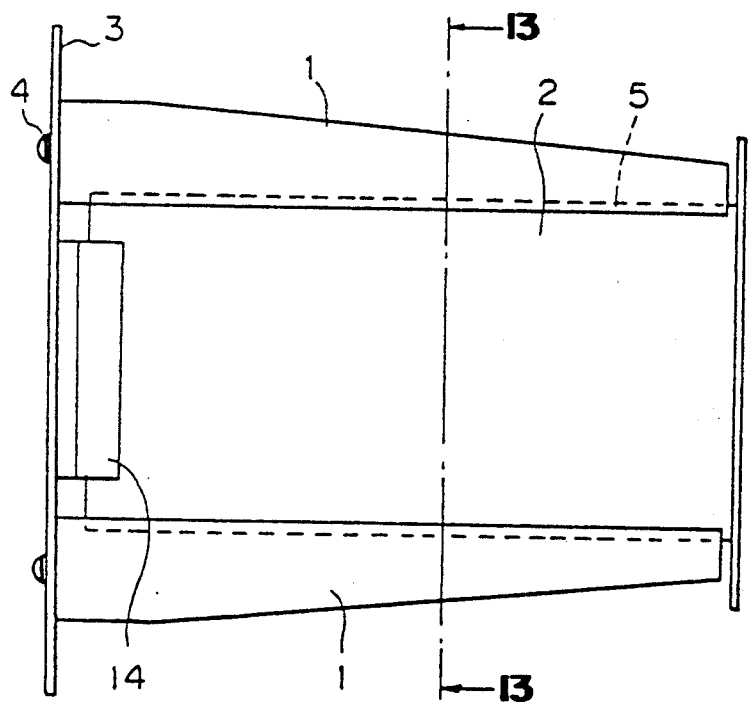
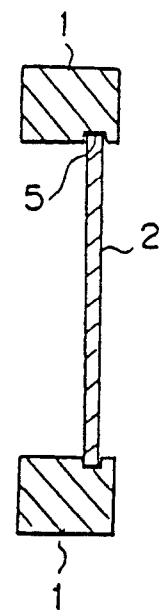

STRUCTURE FOR HOLDING PACKAGES ON BACKBOARD OF ELECTRONICS APPARATUS

BACKGROUND OF THE INVENTION

1. Field of the Invention

The present invention relates to a structure for holding packages on a backboard of an electronics apparatus such as a communication/information apparatus, in which a plurality of packages, each consisting of a printed circuit board mounting electronics devices thereon, are held in parallel to each other by a connector connection with a common backboard.

2. Description of the Related Arts

Recently, a tendency toward a densifying of the mounting of a communication/information apparatus has been further accelerated by the development of an LSI technology and of an optical communication technology. The densified mounting tendency is not only for an electronics device in itself, but also for a package consisting of a printed circuit board on which such electronics devices are mounted. Accordingly, a prior art circuit structure requiring a large size printed circuit board can be accommodated in a smaller printed circuit board ½ or ⅓ of the former size.

Generally, a larger size printed circuit board is preferable in view of the mounting efficiency and manufacturing costs, but in a communication/information system, a small size package consisting of a split printed circuit board is more preferable, to ease the affects of a machine failure and an initial investment burden on a customer. Therefore, recently an electronics apparatus has been proposed in which various size packages corresponding to the purpose thereof are assembled on a common backboard.

In the conventional electronics apparatus in which same size packages are assembled, a common structure for accommodating such packages can be used, but an exclusive structure becomes necessary when accommodating various size packages in one apparatus, and thus problems arise of increased manufacturing costs and delayed deliveries.

To solve these problems, as shown in FIGS. 13(a) and 13(b), a holding structure for packages has been proposed, which comprises a pair of upper and lower guide rails 1 fixed at a base end thereof on a backboard 3 by screws 4, the guide rails being spaced from each other by a distance corresponding to a size of a package 2 to be mounted to the backboard. The package 2 is introduced from an open space between the pair of guide rails 1, led along longitudinal grooves 5 formed on opposite sides thereof, and connected to pins projected from the backboard 3 by a connector 14 fixed to the leading edge of the package 2.

In this structure, however, the package 2 tends to move out of position due to a bending of the guide rails 1 when the weight of the package 2 is large.

In addition, recently the number of pins has been increased, due to the high density mounting, and therefore, a larger force is required for an insertion/withdrawal of connectors connecting the package and the backboard, and thus a card lever must be provided on the package for carrying out the insertion/withdrawal operation. In this case, the guide rails are liable to be bent by a reaction to the force required for operating the card lever, and thus prevent a smooth insertion/withdrawal of the package.

Another solution is provided as shown in FIGS. 14(a) and 14(b), in which a plate-like accommodation frame 6 having a size corresponding to a package 2 to be mounted is prepared and fixed on a backboard 3 at the base end thereof by screws 4. A pair of upper and lower longitudinal grooves 5 are arranged on laterally extended rail portions 7 in upper and lower areas of the frame 6, opposite to each other, and the package 2 is introduced between the rail portions 7 along the grooves 5 into the frame 6, and connected to the backboard 3 by a connector 14.

In this structure, the above problem regarding the bending inherent to the preceding conventional structure is solved because the frame 6 integrally interconnects the upper and lower rail portions. Nevertheless, this structure has drawbacks in that a height of electronics devices and mechanical parts mounted on the package is limited, whereby the freedom of design is lowered, and in that various exclusive accommodation frames are necessary for respective packages having different sizes.

Further, as a drawback common to these two prior art structures, it is difficult to coincide the position of a connector on the package with that of a connector housing on the backboard. A primary reason for this resides in dimensional errors in an assembly of the holding structure, because the connector housing and the guide rails are manufactured as separate parts. A secondary reason resides in a higher variance in the thickness of printed circuit boards, compared to the manufacturing tolerance of other parts, whereby in the course of the assembly of packages on the backboard, the positions of the connectors of the respective printed circuit boards arranged perpendicular to the common backboard tend to vary as the thickness of the printed circuit board varies, if an erroneous reference plane is selected during the introduction of the package along the guide rails.

SUMMARY OF THE INVENTION

Accordingly, an object of the present invention is to solve the above drawbacks of the prior art and provide a package holding structure to which various-sized packages can be smoothly mounted without vacant spaces therebetween, which structure is formed by the provision of a minimum number of standard structural parts on the backboard.

The above object is achieved, according to the present invention, by a package holding structure for supporting packages in an electronics apparatus, comprising at least a package having a rectangular shape and a connector on one surface along the rear edge thereof, and a backboard positioned vertical to the packages and having rows of contact pins projected therefrom; the connector on the package and the contact pins on the backboard being fitted to each other to form an integral body. The package holding structure comprises a pair of linear guide members secured on the package along the respective edges thereof opposite to each other, and perpendicular to the edge on which the connector is mounted; and a pair of support members for receiving the respective guide members, secured at one end thereof on the backboard in a cantilever manner to project outwardly therefrom, and intervened between the rows of contact pins. The linear guide member has a lengthwise groove for receiving the corresponding edge of the package, with a pair of inner walls; the guide member being fixed to the package while one of the inner walls of the groove is tightly in contact with the connector-mounting surface of the package. The support member has a slide groove having a cross-section and dimension allowing a lengthwise movement of the linear guide member but preventing other directional movements thereof, and a connector housing at the base end thereof for receiving the connector on the package, having positioning apertures fitted to corresponding parts of the contact pins.

The package holding structure according to the present invention is operated as follows:

When assembling the electronics apparatus, the pair of support members are positioned on the backboard so that a distance between the support members corresponds to a height of the package to be assembled, and are fixed thereto while fitting the positioning apertures on the connector housing to the corresponding contact pins on the backboard.

The package is prepared by fixing the pair of linear guide members along the opposite edges of the package while one of the inner walls (hereinafter referred to as a "reference surface") of the lengthwise groove is tightly in contact with the connector-mounting surface of the package. Accordingly, the height of the connector protruded above the reference surface is constantly kept accurate regardless of thickness variations of the printed circuit board of the package.

The package is introduced from the free ends of the pair of support members into a space therebetween, and accurately guided toward the backboard along the slide grooves without lateral vibration.

At the end of this insertion stroke, the connector on the package is properly fitted in the connector housing on the backboard and engaged with the contact pins, and thus the support member is associated with the mated support member via the linear guide members and the package, whereby a strong connection of the package with the backboard is obtained while maintaining an accurate positional relationship between the respective parts.

According to another aspect of the present invention, a backboard structure suitably used for the package holding structure as described is proposed, wherein the backboard consists of a first backboard and a second backboard, arranged in parallel to each other, both backboards being rigidly connected by contact pins pierced therethrough to form an integral body with a distance therebetween.

BRIEF DESCRIPTION OF THE DRAWINGS

The other objects and further advantages of the present invention will be more apparent with reference to the preferred embodiments illustrated in the attached drawings wherein:

FIGS. 13(a) and 13(b) are, respectively, a side view and a cross-section view taken along the line 13—13 of a conventional package holding structure;

DESCRIPTION OF THE PREFERRED EMBODIMENTS

Package Holding Structure

Figure 3:
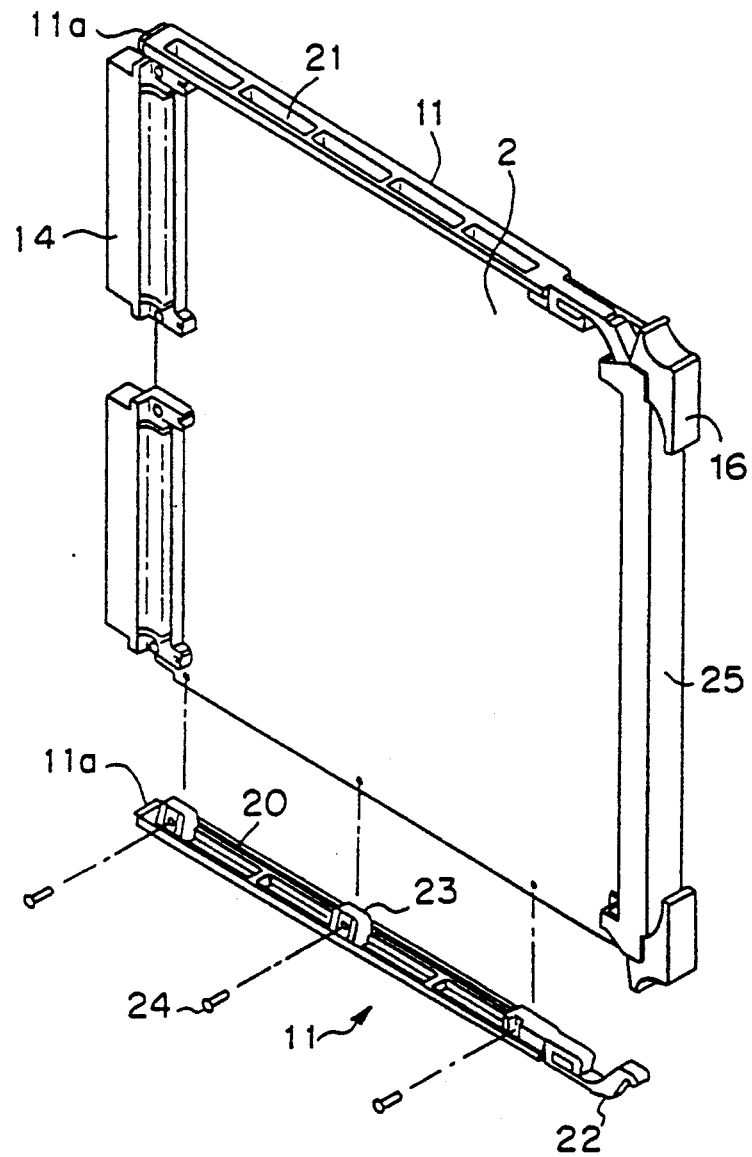
FIG. 3 is a perspective view illustrating a structure of linear guide members and a package according to the present invention.

A package holding structure, according to the present invention, for supporting a package, comprises a pair of support members 10, 10 fixed to a backboard 3 (see FIG. 1) and a pair of linear guide members 11, 11 fixed to a package 2 (see FIG. 3).

Figure 1:
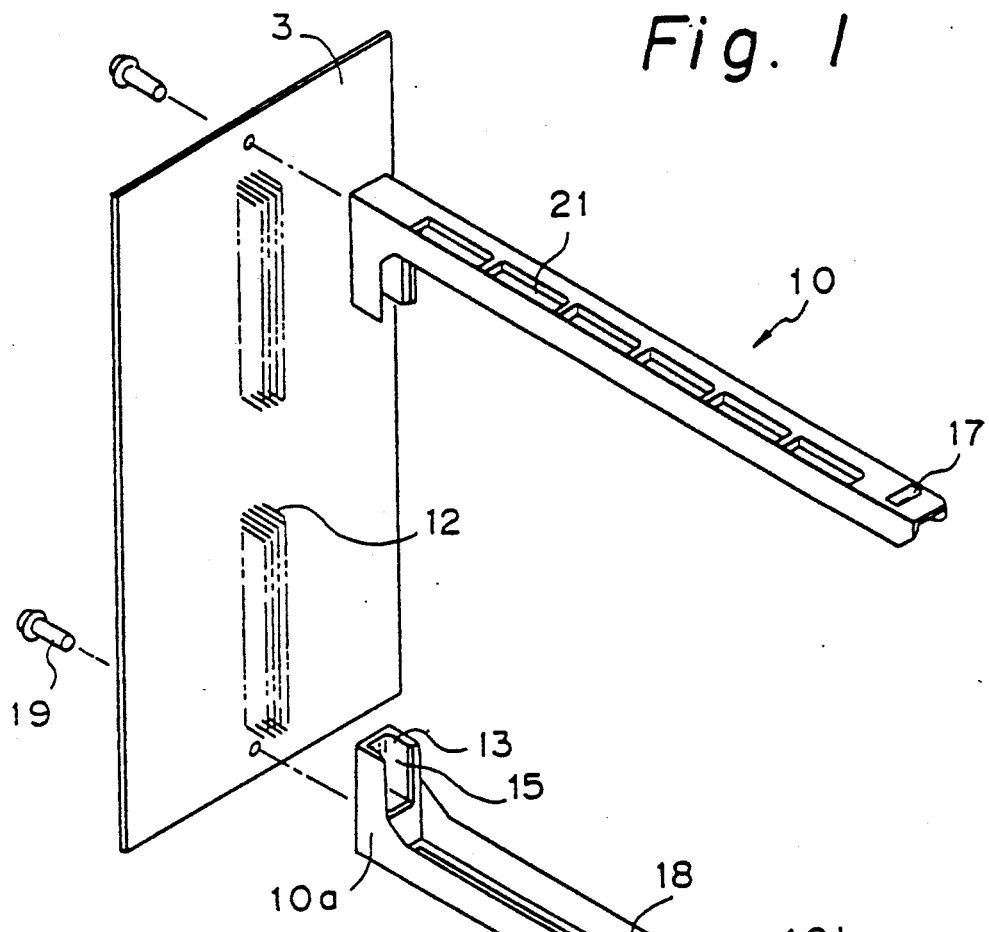
FIG. 1 is a perspective view illustrating a structure of support members and a backboard according to the present invention.

As shown in FIG. 1, the support member 10 is a molded plastic part having a substantially U-shaped cross-section and a short edge portion 10a and a long edge portion 10b intersecting each other at a right angle. Another support member 10 having a shape symmetrical thereto is combined as a mating member, to form a pair. In a back wall of the short edge portion 10a are formed a plurality of positioning apertures 13 engageable with rows of contact pins 12 arranged on a predetermined area of the backboard 3. The short edge portion 10a also forms a housing 15 for receiving a connector 14 secured on the package.

In a bottom wall of the long edge portion 10b are formed ventilation openings 21 along the whole length thereof, for cooling heat generated from electronics devices mounted on the package. A slot 17 is provided at the tip end of the long edge portion 10b and receives a projection 16a of a card lever 16 described later.

Figure 2:
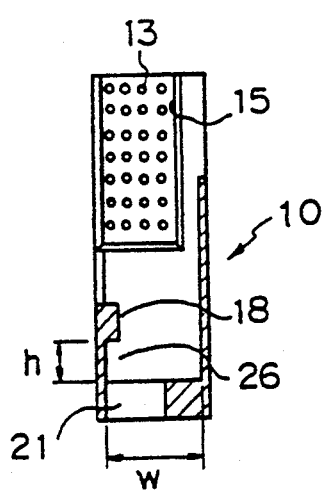
FIG. 2 is a cross-section of the support member along lines I—I of FIG. 1.

As shown in FIG. 2, a laterally protruded longitudinal rib 18 extends along the whole length of inner edge of one of the side walls of the long edge portion 10b.

The respective support members 10, 10 of this pair are arranged on the backboard 3 in such a manner that a back wall of the short edge portion 10a is in parallel to the backboard 3 and the open sides of the U-shaped cross-section of the respective long edge portion 10b are opposite to each other while the distance therebetween is kept at a value corresponding to a height of the package 2, and fixed in place on the backboard 3 by screws or rivets 19 to thus project from the backboard 3 in a cantilever manner, while engaging the positioning apertures 13 with the rows of contact pins 12.

As shown in FIG. 3, the linear guide member 11 is a molded part of plastic having a length corresponding to that of package 2. On one side surface of the guide member 11 is provided a groove 20 for mounting the package. The groove 20 has an inner width wider than the wall thickness of the package 2, along which mountings 23 for rivet are arranged at a proper spacing. In the bottom wall adjacent to the mountings 23, ventilation openings 21 similar to the openings 21 of the support member are formed along the whole length thereof.

A resiliently deformable lock arm 22 is formed at a tip end of the linear guide member 11 and operates in association with the card lever 16.

The linear guide member 11 is mounted on the package 2 along a pair of edges thereof perpendicular to the edge to which the connector 14 is arranged, i.e., the package 2 is inserted into the groove 20 at the guide member and fixed thereto by the rivets 24 inserted laterally through the mountings 23.

Figure 4:
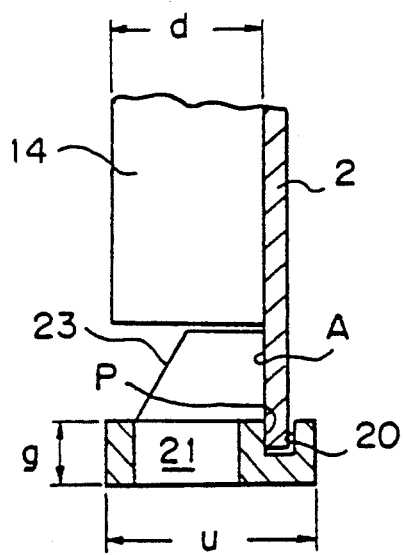
FIG. 4 is a cross-section illustrating the positional relationship between the linear guide member and the package.

It is important that, due to the rivet fastening as stated above, the connector-mounting surface A of the package 2 is tightly in contact with the inner wall P of the groove 20 as illustrated in FIG. 4, whereby a distance d between the inner wall P (referred to as a "reference surface") and the outer surface of the connector 14 is always kept constant regardless of considerable thickness variations in the printed circuit board of the package 2 due to the lower manufacturing tolerances thereof. This is one of the conditions for the smooth engagement between the connector 14 and the contact pins 12 on the backboard.

A front plate 25 is attached along the whole length of a front edge of the package 2, and a pair of card levers 16 are secured at the opposite ends of the front edge for carrying out the insertion/withdrawal of the package.

A slide groove 26 extends beneath the rib 18 lengthwise of the long edge portion 10b. The slide groove 26 is formed to have an accurate height h and an inner width w (see FIG. 2) so that it can receive the linear guide member 11 having a height g and an outer width u (see FIG. 4) without play therebetween but with a smooth slidability. A tip end 11a of the linear guide member 11 is chamfered.

Figure 5:
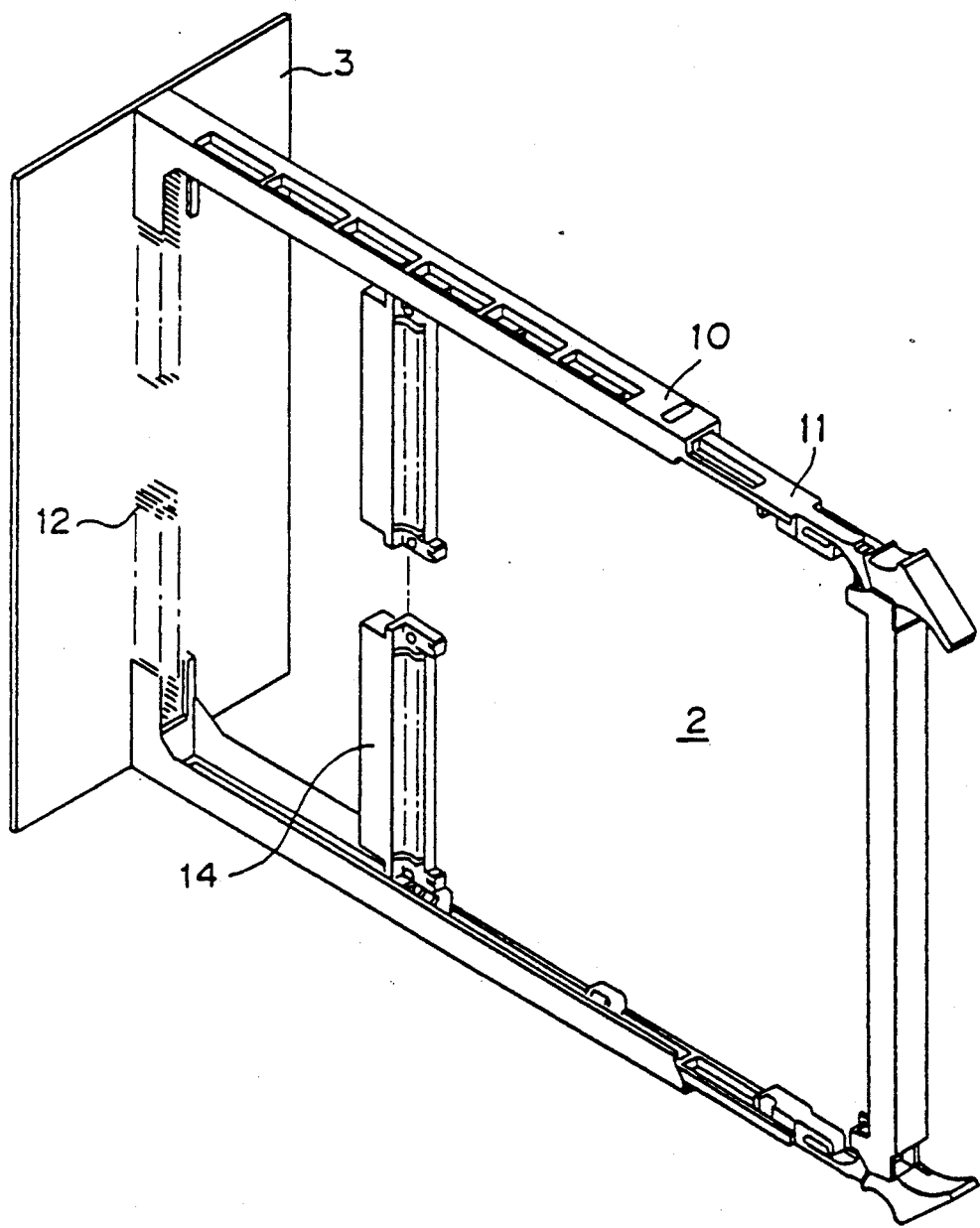
FIG. 5 is a perspective view of the package relative to the support members at a midway point of the insertion stroke.

When the package 2 is to be mounted at the predetermined position on the backboard 3 and connected to the latter by the connector, the linear guide members 11 fixed to the upper and lower edges of the package 2 are introduced to the pair of support members 10 projected in a cantilever manner from the backboard 3. Then both the members 10, 11 are smoothly engaged with each other due to the above dimensional relationships and the shape of the tip end of the guide member 11, and guide member 11 can slide in the lengthwise direction but any up-down fluctuation thereof is inhibited by the rib 18 of the support member 10. A state thereof at a midway point of the insertion stroke is illustrated in FIG. 5.

Figure 6:
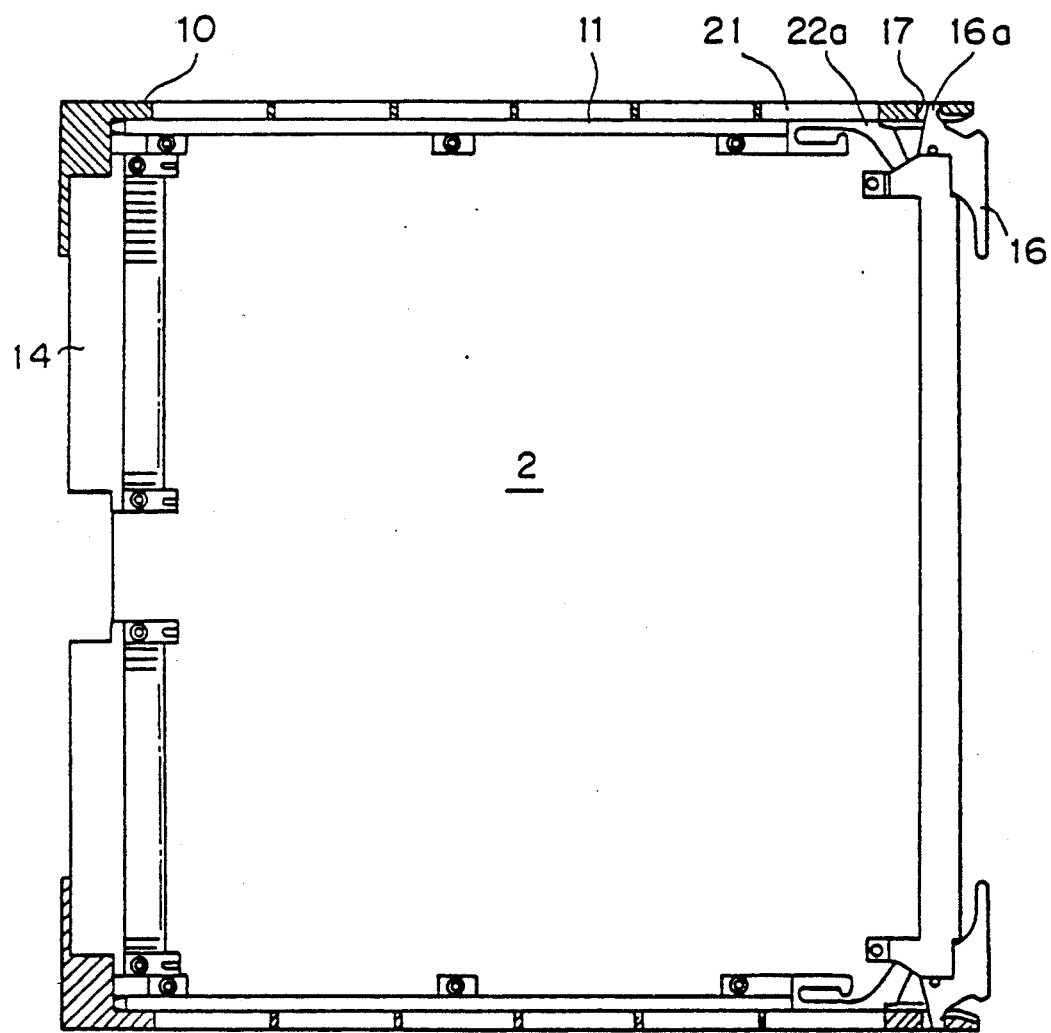
FIG. 6 is a side sectional view of the package when the insertion stroke is completed.

This insertion of the package is carried out with a highly accurate engagement between the slide groove 26 of the support member 10 and the linear guide member 11, and the connector 14 on the package 2 is correctly received by the housing 15 on the backboard 3 so that it can be connected with the contact pins 15. When the insertion of the package 2 has been completed, the projection 16a of the card lever 16 is fitted into the slot 17, and simultaneously, a latch 22a of the lock arm 22 is caught by an edge of the ventilation opening 21 to lock the package 2 in place, as shown in FIG. 6.

As stated above, when the upper and lower support members are connected with each other through the package, with the linear guide members, the rigidity of the support members is increased compared to that obtained when the respective support member is engaged with the package without the linear guide member, whereby the package holding function of the support member is enhanced.

Figure 7:
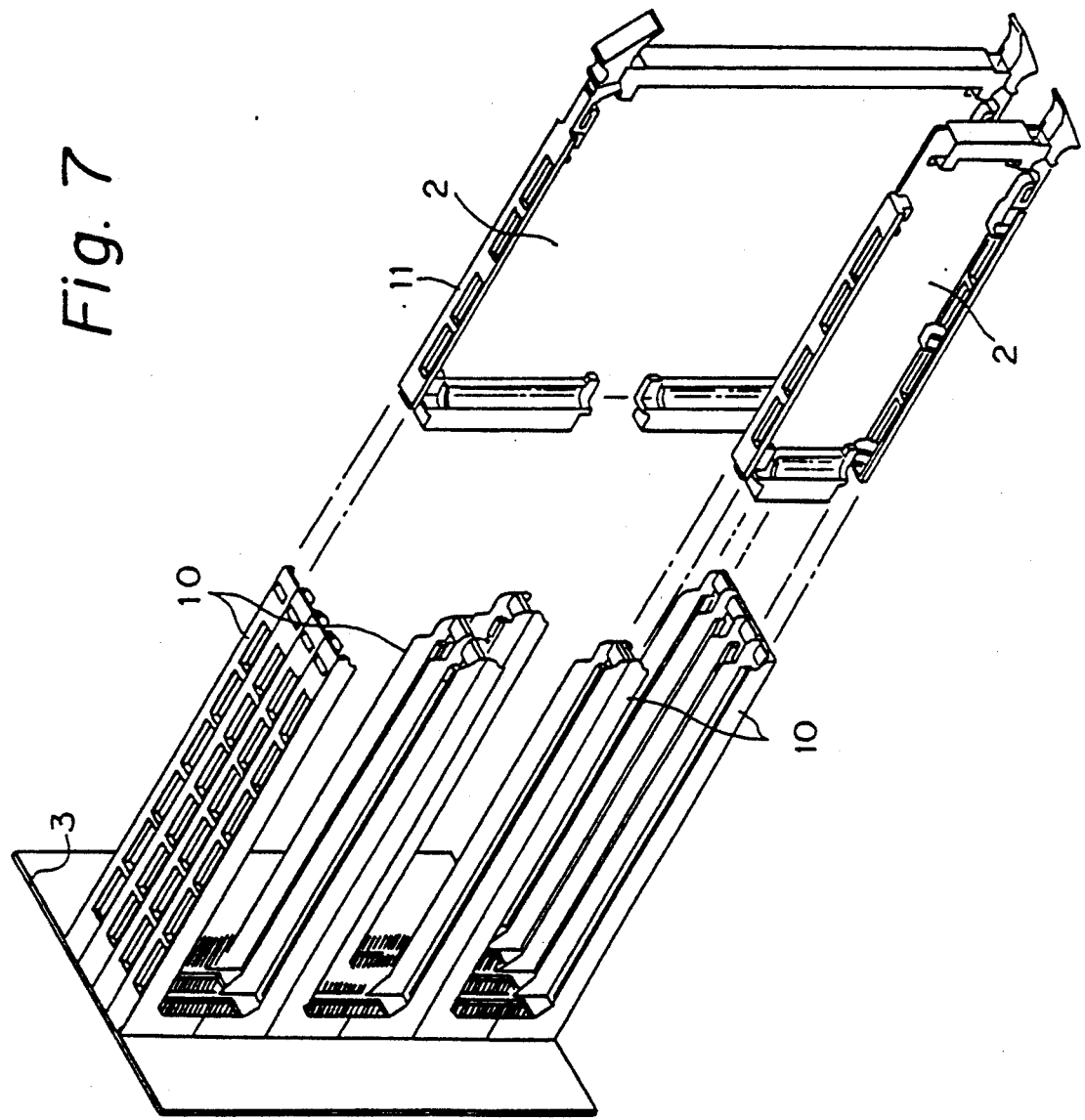
FIG. 7 is a perspective view of a first arrangement using the package holding structure according to the present invention.
Figure 8:
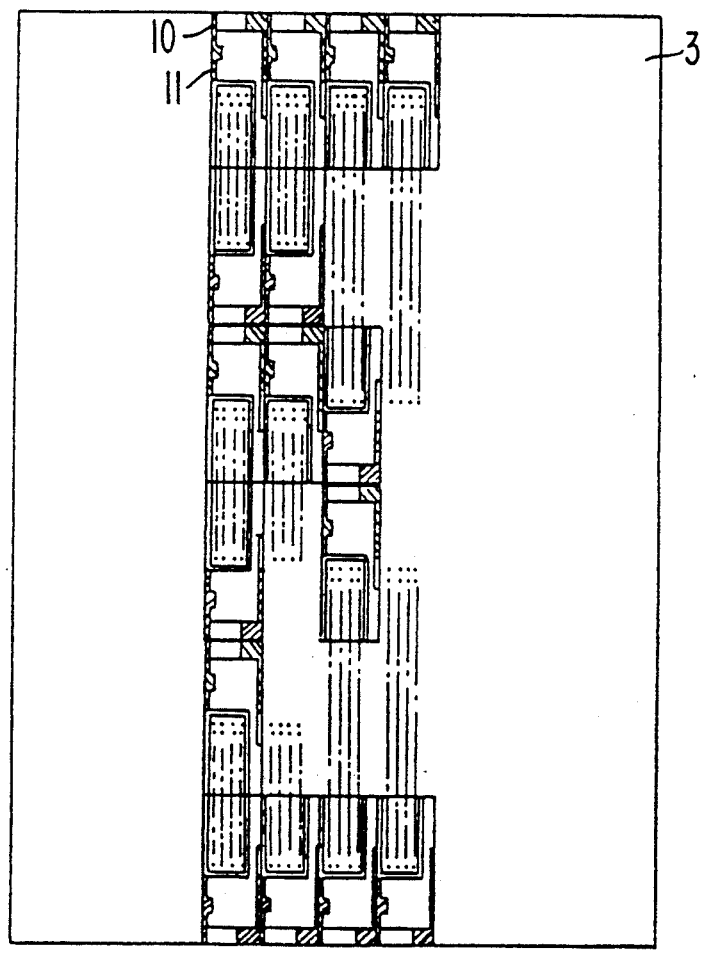
FIG. 8 is a front view of the arrangement shown in FIG. 7.

FIGS. 7 and 8 illustrate a first arrangement based on the above-stated principle of the present invention, in which several kinds of packages having a size different from each other are mounted on a common backboard so that the respective support member is positioned at a minimum lateral pitch, i.e., without any vacant space between adjacent packages.

Figure 9:
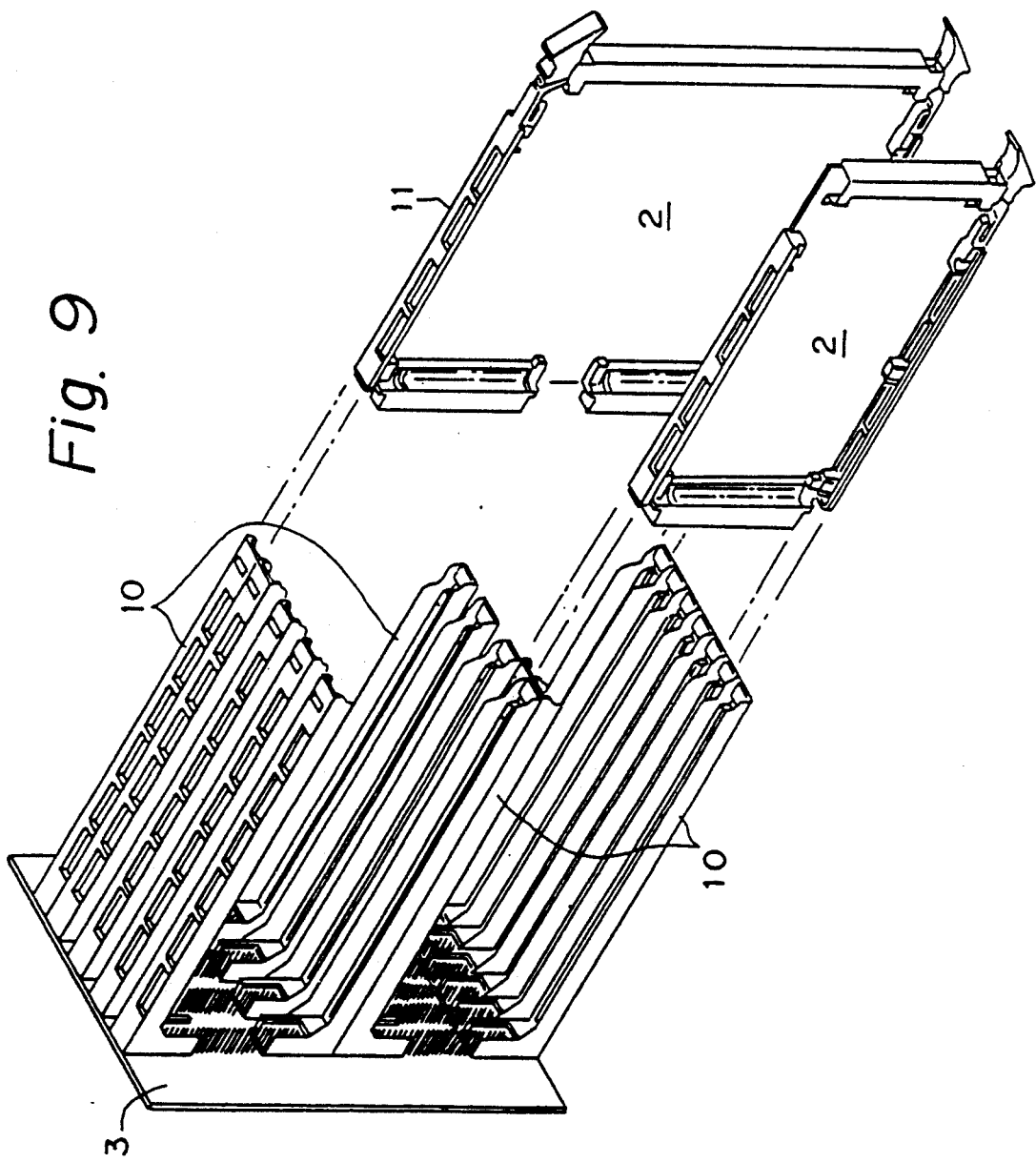
FIG. 9 is a perspective view of a second arrangement using the package holding structure according to the present invention.
Figure 10:
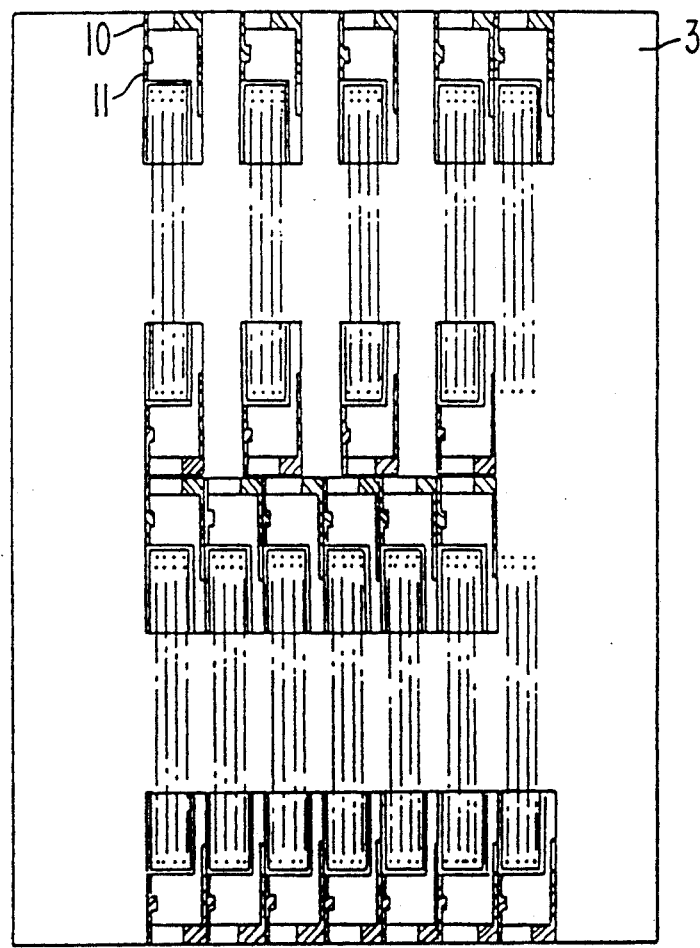
FIG. 10 is a front view of the arrangement shown in FIG. 9.

FIGS. 9 and 10 illustrate a second arrangement in which the support members are positioned at optional lateral pitches.

Figure 11:
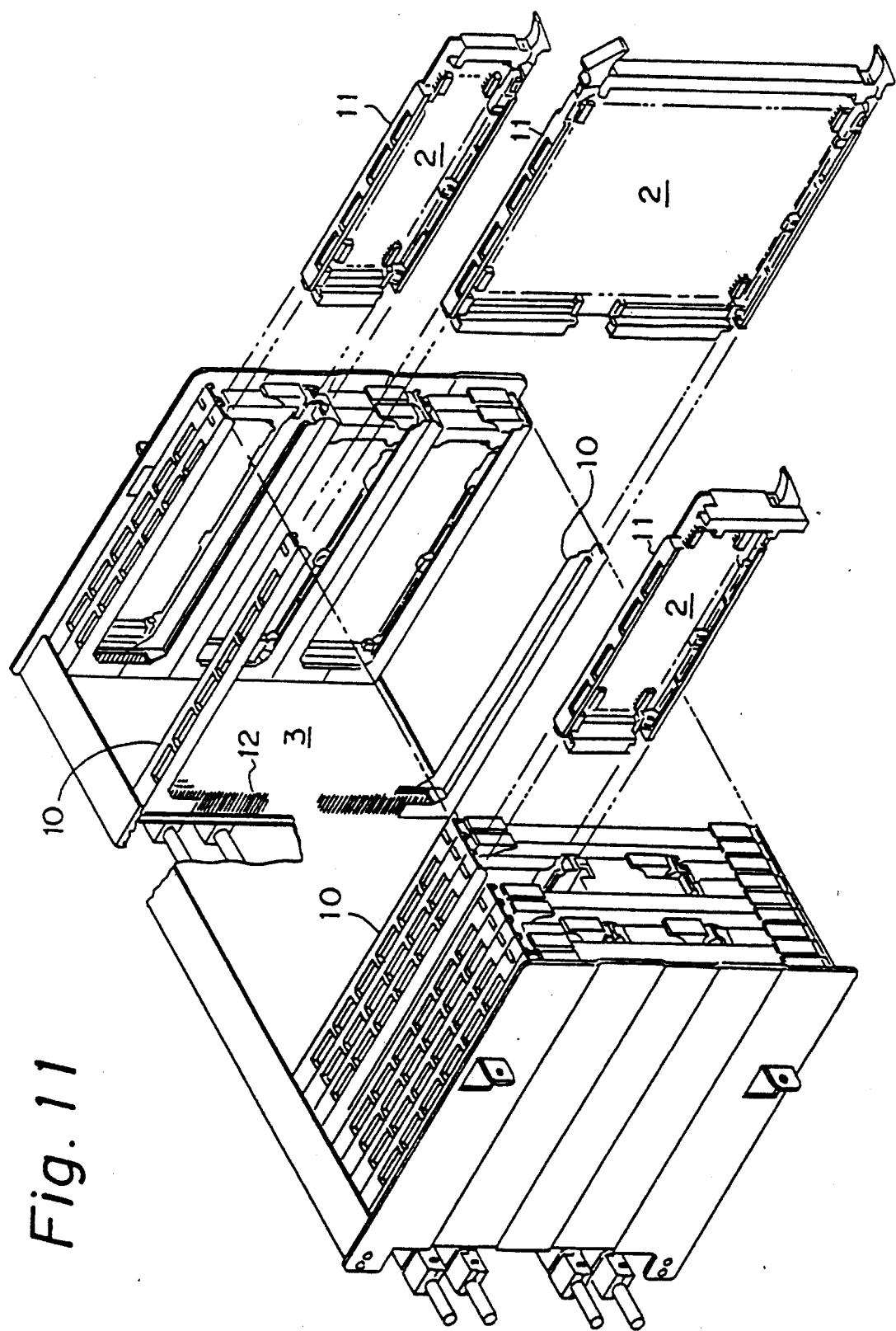
FIG. 11 is a perspective view of a third arrangement using the package holding structure according to the present invention.

FIG. 11 illustrates a third arrangement in which a package holding structure according to the present invention is applied to a casing, such as a shelf, for accommodating different sized packages.

Figure 12:
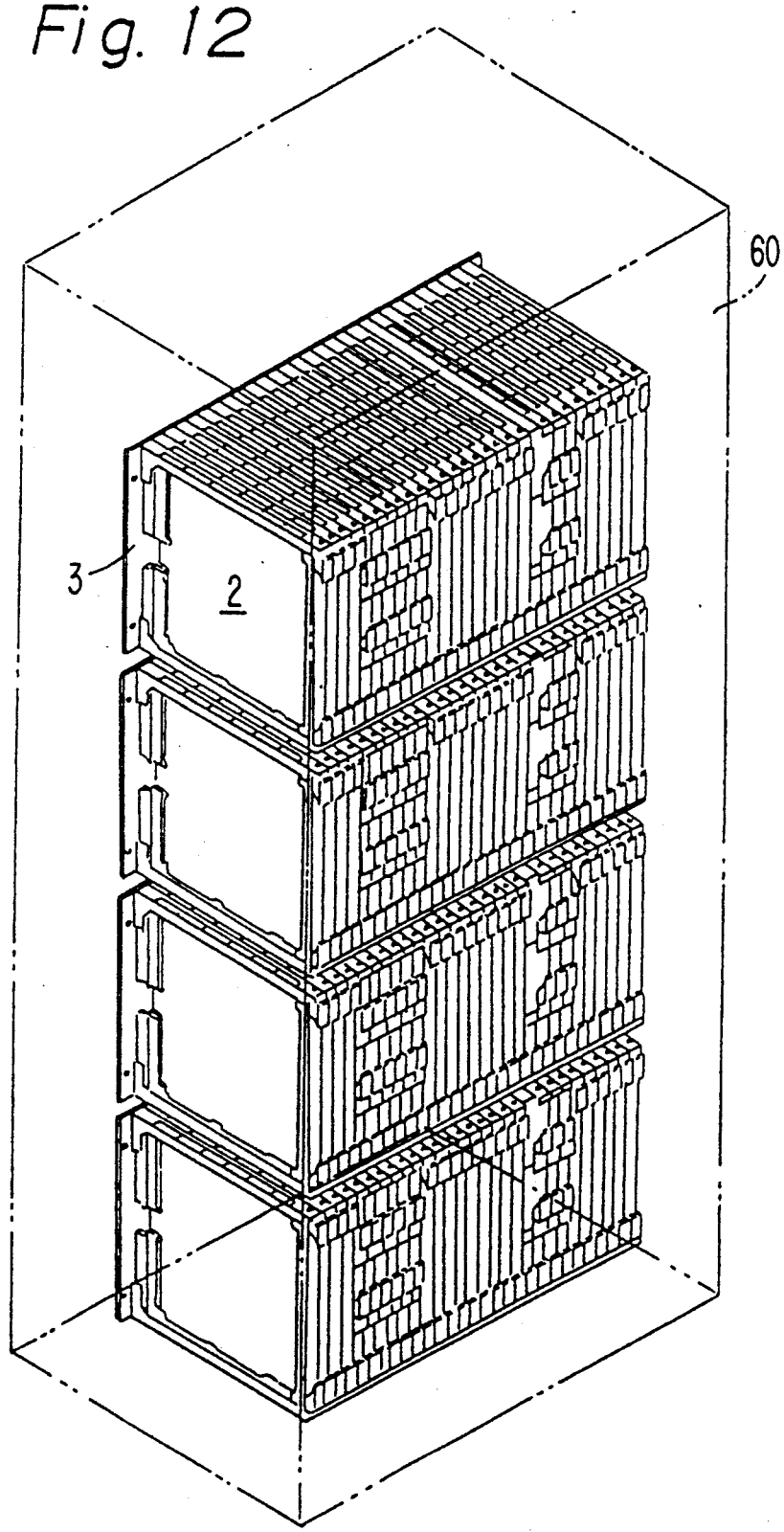
FIG. 12 is a perspective view of a fourth arrangement using the package holding structure according to the present invention.
Figures 14A, 14B:
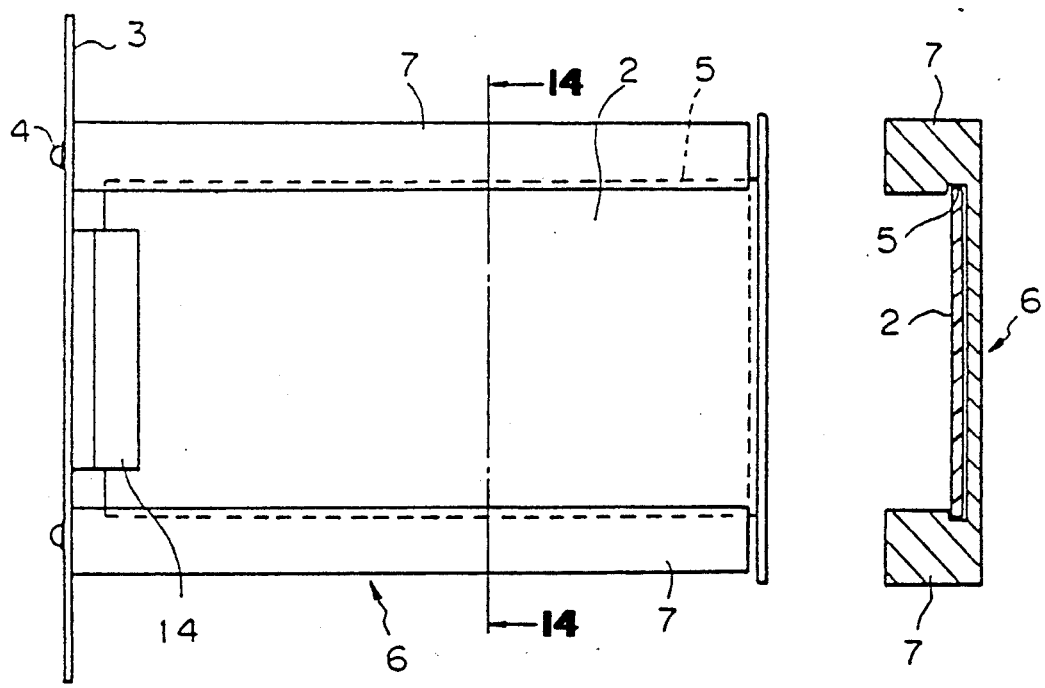
FIGS. 14(a) and 14(b) are, respectively, a side view and a cross-section view taken along the line 14—14 are of another conventional package holding structure.

FIG. 12 illustrates a fourth arrangement in which a plurality of assemblies of backboard and packages 2 having different sizes and formed in a manner similar to the first and second arrangements are stacked in a cabinet rack 60.

In conclusion, according to the present invention, the package can be effectively arranged at a desired position on the backboard, and thus this can be applied to current electronics apparatuses which required a very dense mounting. Also, this results in an improvement of the productivity as well as a lowering of total cost of the electronics apparatus.

More specifically, a support member is reinforced by the engagement of the linear guide member with a groove of the support member when the package is introduced between upper and lower support members. Accordingly, even if the ventilation opening is formed on the support member, this does not affect the rigidity of the support member. For the same reason, the support member can have a thinner wall and/or a longer wall.

The support member has sufficient rigidity to withstand a reaction generated when the card lever is actuated, and thus there is no positional deflection of the support member due to a deformation thereof.

As one inner side wall of the groove of the linear guide member is in close contact with the connector-mounting surface of the package when the linear guide member is fixed on the package, the mounting accuracy of the connector is improved regardless of thickness variations of the printed circuit board, and accordingly, the connector can be smoothly connected with the pins on the backboard.

As the support member itself has a function for guiding the package and for accommodating the connector, and is provided with positioning apertures for a direct engagement with the contact pins on the backboard, an accurate connection between the package and the backboard through the connector is obtained.

Backboard Structure

According to the above package holding structure, the backboard is preferably reinforced, to thus be able to withstand the additional weight of the support member and the linear guide member, as well as the force needed for connecting the connector with the increased number of pins.

Figure 15:
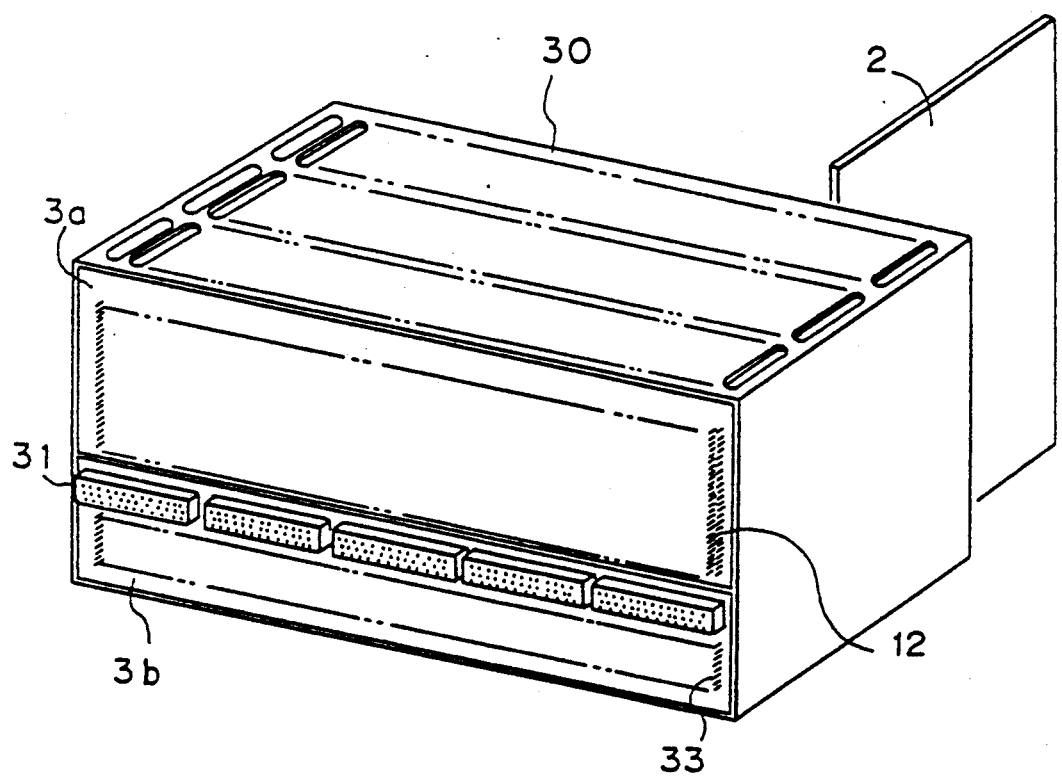
FIG. 15 is a perspective view of an electronics apparatus having a backboard structure according to the present invention.
Figure 16:
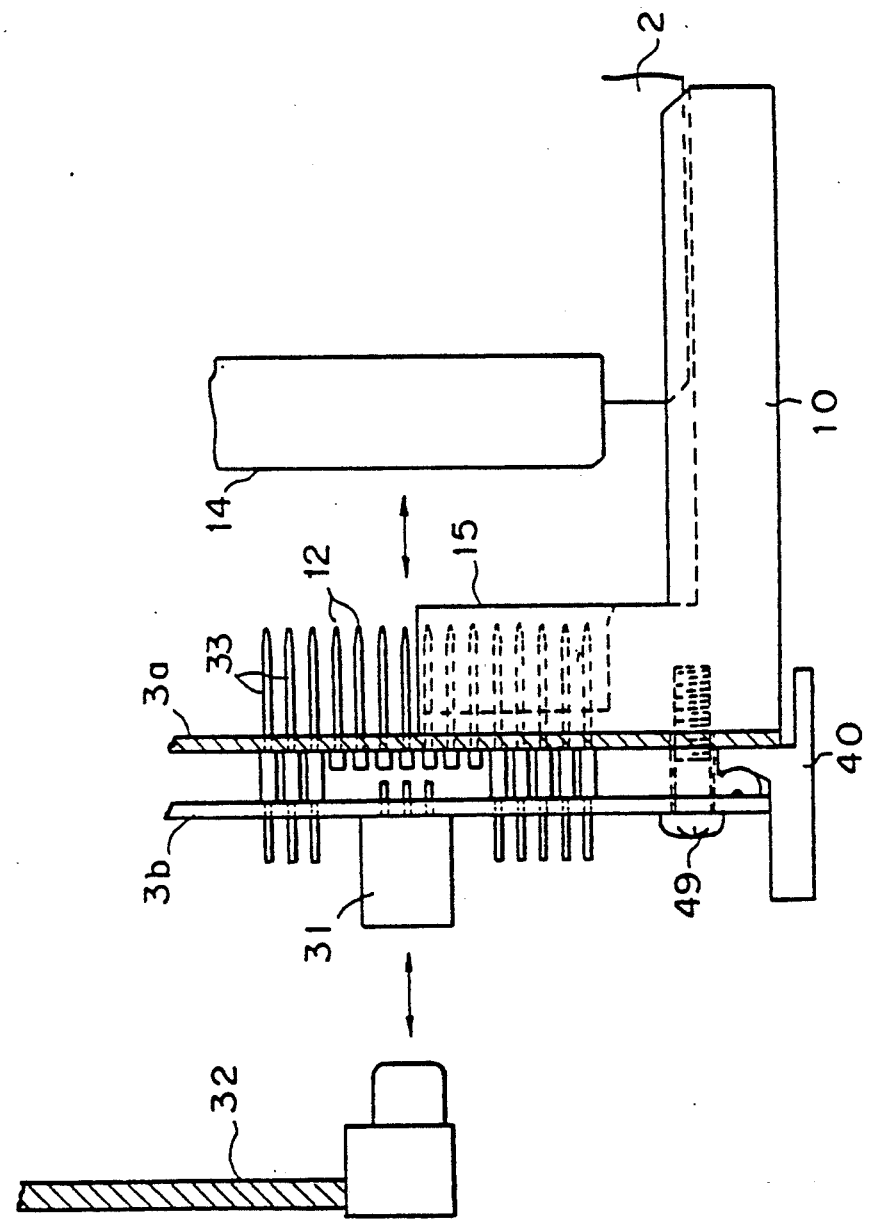
FIG. 16 is a partial enlarged sectional view of the backboard structure shown in FIG. 15.

As shown in FIGS. 15 and 16, according to this embodiment, a backboard is separated into a first backboard 3a for the interconnection between packages 2 arranged on the backboard and a second backboard 3b for the connection between the backboard and outer circuits.

Figure 17:
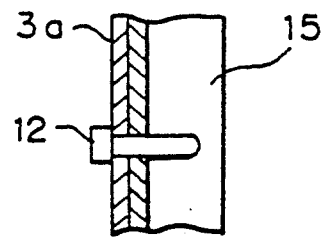
FIG. 17 is a sectional view illustrating a fastening of a connector housing on a backboard by a short contact pin.

As usual, rows of short contact pins 12 are implanted in the first backboard 3a and connected to printed circuits built-in to the backboard 3a. As described before, a housing 15 of a support member 10 is fixed on the first backboard 3 by press-fitting the short contact pins 12 into positioning apertures 13 of the housing 15 (see FIG. 17).

The second backboard 3b is arranged outside of the first backboard 3a and in parallel thereto, with a distance therebetween. In this embodiment, the second backboard 3b has half the height of the first backboard 3a. The upper edge of the second backboard 3b carries a series arrangement of a plurality of interface connectors 31 to which cables 32 from the outer circuits are introduced.

In the lower region of the backboard 3b beneath the interface connectors 31 are implanted a plurality of long contact pins 33, which penetrate the first backboard 3a through apertures 13 and project from the inner surface of the first backboard 3a. The long contact pins 33 are connected with the interface connector 31 through printed circuits built-in to the second backboard 3b.

Figure 18:
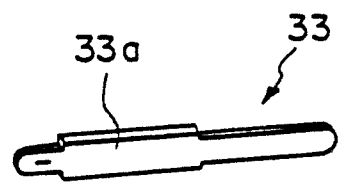
FIG. 18 is a perspective view of a long contact pin for connecting first and second backboards.

As shown in FIG. 18, the long contact pin 33 has a wider central portion 33a which acts as a spacer for maintaining a predetermined distance between the backboards 3a, 3b.

Figure 19:
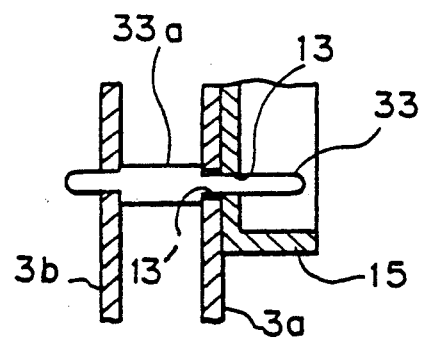
FIG. 19 is a sectional view illustrating a fastening of a connector housing on a backboard by a long contact pin.

As shown in FIG. 19, the tip end of the long contact pin 33 projecting from the first backboard 3a is also press-fitted to the positioning aperture 13 provided on the back wall of the housing 15, through an aperture 13' formed on the first backboard 3a. According to this arrangement, the outer circuits are connected with the respective package 2 when the connector 14 is engaged with the housing 15.

Figure 20:
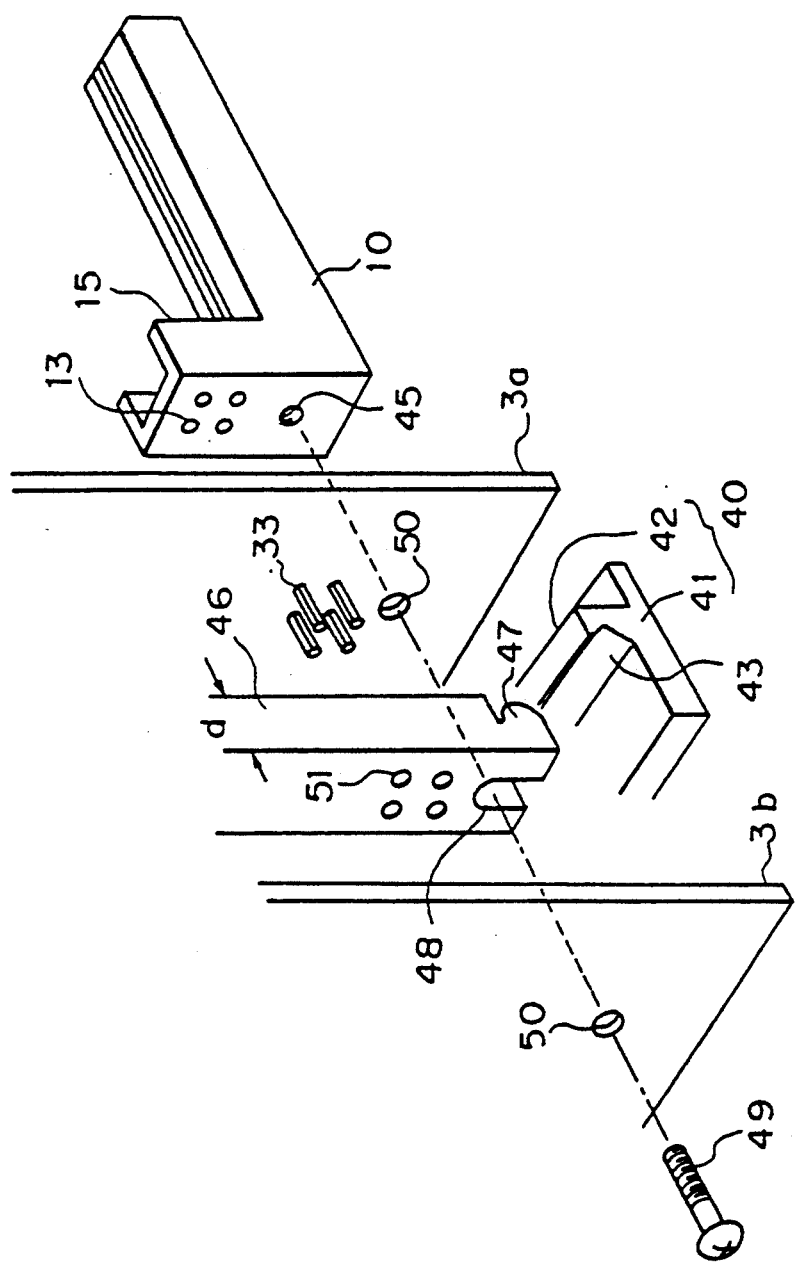
FIG. 20 is an exploded view of another embodiment of the backboard structure according to the present invention.

To further improve the rigidity, a horizontal reinforcement member 40 is provided between the first backboard 3a and the second backboard 3b, along the upper and lower edges of thereof. In this connection, to clarify the drawing, the upper reinforcement member is omitted in FIG. 20 and only the lower reinforcement member is illustrated. The reinforcement member 40 consists of a base plate 41 and a rib 42 protruded upwardly therefrom. The rib 42 has a lengthwise recess 43 in a triangular cross-section in the front wall thereof. The backboards 3a and 3b are positioned on the opposite edge regions of the base plate 41 with the rib 42 intervening therebetween.

As stated before, the support member 10 is mounted on the predetermined position of the first backboard 3a, for introducing the package 2, and the support member 10 has a screw hole 45 on the base thereof.

Figure 21:
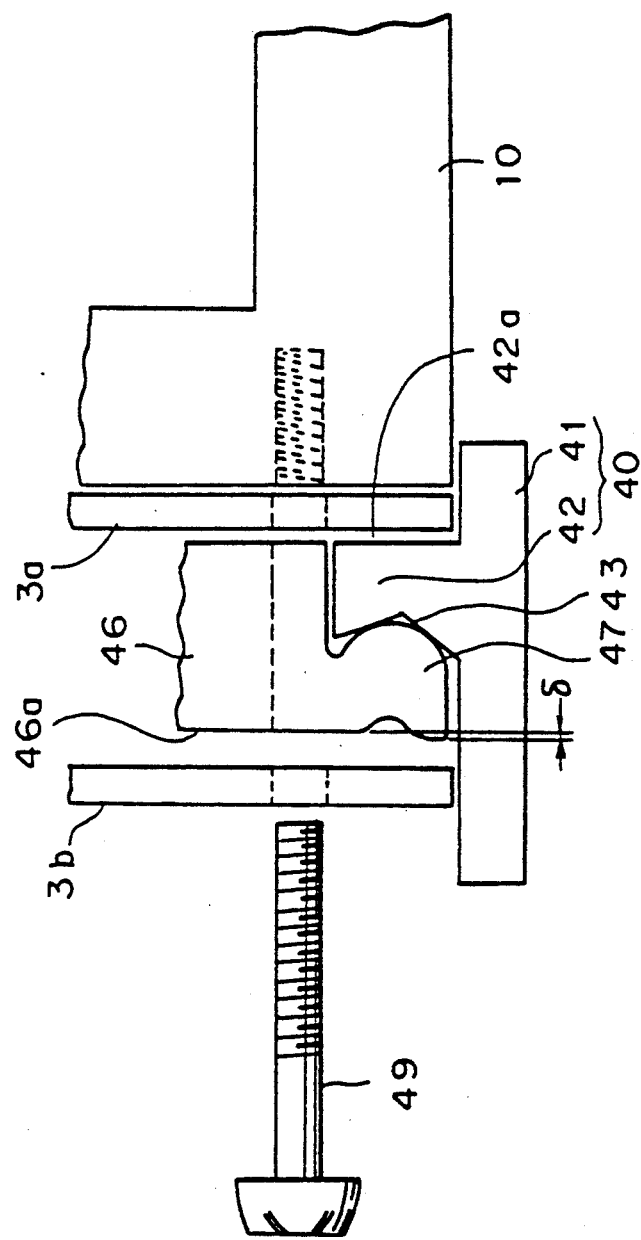
FIG. 21 is a partial enlarged view of the backboard structure shown in FIG. 20.

A vertical spacer element 46 is arranged between the upper and lower reinforcement members 40 at a position corresponding to that of the support member 10. The spacer element 46 is made of rigid plastic and has a constant thickness d, except for the upper and lower end region having an abutment 47 with a special cross-sectional shape. A notch 48 is formed in the abutment 47. As shown in FIG. 21, the arcuate rear surface of the abutment 47 is engaged with the lengthwise recess 43 of the reinforcement member 40 when positioned in place.

This state will be described below in more detail with reference to FIG. 21.

The rib 42 has a flat and vertical rear wall 42a closely in contact with the first backboard 3a. Also, the spacer element 46 has a flat and vertical front wall 46a to be closely in contact with the second backboard 3b. The front end of the abutment 47 projects forward from the front wall 46a of the spacer element 46 by a distance δ.

Figure 22:
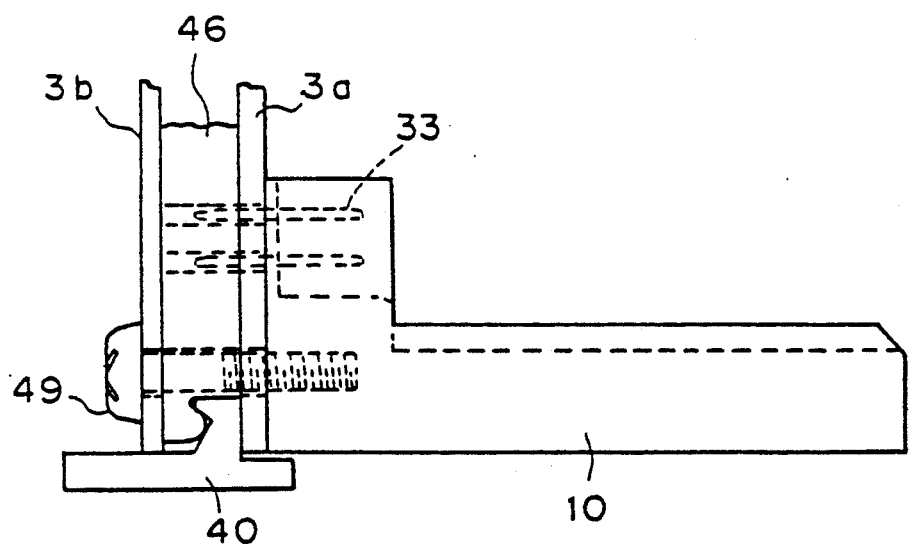
FIG. 22 is a sectional view of the assembled backboard structure shown in FIGS. 20 and 21.

A screw 49 is inserted from the second backboard side through the respective members thus positioned in place. The tip end of the screw 49 projected from the first backboard 3a via the notch 48 is threadedly engaged with a screw hold 45 on the support member 10, to rigidly fasten the respective members together to form an integral assembly. The above distance δ allows the resilient deformation of the abutment 47 during this fastening by the screw 49, so that the fastening force is increased. The assembled state thus obtained is illustrated in FIG. 22.

We claim:

1. An electronics circuit apparatus comprising:
   at least one printed circuit board in the form of a rectangular package having a front edge, a rear edge and opposite side edges;
   a connector mounted at said rear edge of said package on one side surface thereof;
   a backboard positioned perpendicularly to said package and having a plurality of first contact pins projecting outwardly therefrom, said contact pins mating with said package connector; and
   a package holding structure, said package holding structure comprising:
   a linear guide member secured to each said side edge of said package, each said guide member having a groove extending lengthwise thereof, said groove having a pair of inner walls for receiving said side edge;
   means fixing each said side edge in each said groove whereby said one side surface of said package on which said connector is mounted is in tight contact with one of said inner walls;
   a pair of spaced support members, each secured at one end to said backboard and projecting outwardly therefrom in a cantilever manner, each said support member having a slide groove extending lengthwise thereof which receives a respective one of said guide members, said slide groove having a cross-sectional configuration and a dimension allowing only a lengthwise movement of said guide member while preventing other directional movements thereof; and a connector housing at said one end of each said support member receiving said package connector, said connector housing having a plurality of positioning apertures therein whereby said first contact pins extend through said apertures.

2. An electronic circuit apparatus as defined in claim 1, wherein the linear guide members and the support members each have a ventilation opening therein for facilitating cooling of said package.

3. An electronic circuit apparatus as defined in claim 1, which further includes a card lever having an operating projection mounted on said front edge of said package and wherein at least one of said support members includes a slot engageable with said projection.

4. An electronic circuit apparatus as defined in claim 3, which further includes a resiliently deformable lock arm having a latch portion which is mounted adjacent a front end of at least one of said guide members whereby with said package fully inserted into said support members said latch portion engages a ventilation opening of said support member.

5. An electronic circuit apparatus as defined in claim 1, wherein said backboard consists of a first backboard and a second backboard arranged in parallel relationship and spaced from each other and wherein said first and second backboards are rigidly connected by second contact pins which extend through both said first and second backboards.

6. An electronic circuit apparatus as defined in claim 5, which further includes an upper horizontal reinforcement member positioned between said first backboard and said second backboard along the upper edges thereof and a lower horizontal reinforcement member positioned between said first and said second backboard along the lower edges thereof and a vertical spacer element positioned between and connected to said upper and lower horizontal reinforcement members adjacent each side edge of said first and second backboards.

7. An electronic circuit apparatus as defined in claim 6, wherein a recess is formed on each of said horizontal reinforcement members and each end of said vertical spacer elements includes an abutment which engages each said recess.

* * * * *

UNITED STATES PATENT AND TRADEMARK OFFICE
CERTIFICATE OF CORRECTION

PATENT NO. : 5,216,578
DATED : June 1, 1993
INVENTOR(S) : ZENITANI et al.

It is certified that error appears in the above-indentified patent and that said Letters Patent is hereby corrected as shown below:

TITLE PAGE: [75] Inventors, line 1, change "Akishima" to --Tokyo--.

Col. 5, line 29, change "rivet" to --rivets--;
line 39, change "at" to --of--.

Col. 6, line 47, change "backboard" to --backboards 3--.

Col. 10, line 15 (Claim 6, line 6), after "first" insert --backboard--.

Signed and Sealed this

Twenty-ninth Day of April, 1997

Attest:

BRUCE LEHMAN

Attesting Officer    Commissioner of Patents and Trademarks